(12) United States Patent
Braun et al.

(10) Patent No.: US 7,187,576 B2
(45) Date of Patent: Mar. 6, 2007

(54) READ OUT SCHEME FOR SEVERAL BITS IN A SINGLE MRAM SOFT LAYER

(75) Inventors: Daniel Braun, Paris (FR); Gerhard Mueller, Munich (DE)

(73) Assignee: Infineon Technologies AG, Munich (DE)

( * ) Notice: Subject to any disclaimer, the term of this patent is extended or adjusted under 35 U.S.C. 154(b) by 225 days.

(21) Appl. No.: 10/925,487

(22) Filed: Aug. 25, 2004

(65) Prior Publication Data

US 2006/0013039 A1 Jan. 19, 2006

Related U.S. Application Data

(60) Provisional application No. 60/589,116, filed on Jul. 19, 2004.

(51) Int. Cl.
*G11C 11/00* (2006.01)

(52) U.S. Cl. ............... 365/158; 365/173; 365/209; 257/295

(58) Field of Classification Search ............ 365/158, 365/171, 173, 209; 257/295
See application file for complete search history.

(56) References Cited

U.S. PATENT DOCUMENTS

| | | | |
|---|---|---|---|
| 6,166,539 A * | 12/2000 | Dahlberg et al. | 324/252 |
| 6,166,948 A | 12/2000 | Parkin et al. | |
| 6,545,906 B1 | 4/2003 | Savtchenko et al. | |
| 6,713,195 B2 * | 3/2004 | Wang et al. | 428/811.2 |
| 6,812,537 B2 * | 11/2004 | Okazawa et al. | 257/421 |
| 6,980,469 B2 * | 12/2005 | Kent et al. | 365/171 |
| 2004/0012994 A1 * | 1/2004 | Slaughter et al. | 365/158 |
| 2004/0065906 A1 * | 4/2004 | Asao | 257/208 |
| 2005/0259463 A1 * | 11/2005 | Lim | 365/158 |

OTHER PUBLICATIONS

Horowitz, P., et al., "The Art of Electronics," 2nd Edition, New York, Cambridge University Press (1989) pp. 88-91 and 255-257.
Tehrani, S., et al., "Recent Developments in Magnetic Tunnel Junction MRAM," IEEE Transactions on Magnetics, vol. 36, No. 5. (Sep. 2000) pp. 2752-2757.
DeBrosse. J., et al., "A High-Speed 128-kb MRAM Core for Future Universal Memory Applications," IEEE Journal of Solid-State Circuits, vol. 39, No. 4, (Apr. 2004) pp. 678-683.
Durlam, M., et al., "A 0.18 μm 4 Mbit Toggling MRAM," 2004 IEEE International Conference on Integrated Circuit Design and Technology, (2004) pp. 27-30.

* cited by examiner

*Primary Examiner*—Hoai V. Ho
(74) *Attorney, Agent, or Firm*—Slater & Matsil, L.L.P.

(57) ABSTRACT

A magnetic tunnel junction (MTJ) device is configured to store at least two bits of data in a single cell utilizing the variable resistance characteristic of a MTJ. The MTJ includes a soft and two fixed magnetic layers with fixed field directions oriented in perpendicular directions. The soft magnetic layer is separated from the fixed layers by insulating layers preferably with different thicknesses, or with different material compositions. The resulting junction resistance can exhibit at least four distinct resistance values dependent on the magnetic orientation of the free magnetic layer. The cell is configured using a pattern with four lobes to store two bits, and eight lobes to store three bits. The resulting cell can be used to provide a fast, non-volatile magnetic random access memory (MRAM) with high density and no need to rewrite stored data after they are read, or as a fast galvanic isolator.

38 Claims, 11 Drawing Sheets

READ OUT SCHEME FOR SEVERAL BITS IN A SINGLE MRAM SOFT LAYER

This application claims the benefit of U.S. Provisional Application No. 60/589,116, filed on Jul. 19, 2004, entitled Read Out Scheme For Several Bits In A Single MRAM Soft Layer, which application is hereby incorporated herein by reference.

CROSS-REFERENCE TO RELATED APPLICATIONS

This application relates to co-pending and commonly assigned parent applications Ser. No. 10/326,367, filed Dec. 20, 2002, entitled "Current Sense Amplifier," Ser. No. 10/937,155, filed Sep. 7, 2004, entitled "Current Sense Amplifier," and Ser. No. 10/982,026, filed Nov. 4, 2004, entitled "Reference Current Source for Current Sense Amplifier and Programmable Resistor Configured with Magnetic Tunnel Junction Cells," which applications are hereby incorporated herein by reference.

TECHNICAL FIELD

Embodiments of the present invention relate generally to using at least two fixed magnetic layers to store a plurality of bits in a single magnetic tunnel junction cell. In particular, embodiments of the present invention relate to magnetic memory cells and to galvanic decouplers that can store or be configured to transmit at least two bits per cell.

BACKGROUND

Semiconductors are used in integrated circuits for electronic applications, including radios, televisions, cell phones, and personal computing devices, as examples. One type of semiconductor device is a semiconductor storage device, such as a dynamic random access memory (DRAM) and flash memory, which uses a charge to store information.

Various memory types are in common use to store digitally a substantial amount of data. DRAMs have moderate cost, are very fast and can have access times on the order of about 30 nanoseconds, but lose the stored data upon loss of electrical power, i.e., they are "volatile". "Flash" memories are non-volatile, and the time required to store the first information in the memory is long (ms-s). Hard-disk drives are substantially lower in cost than DRAMs, are non-volatile, but have access times generally greater than a millisecond. Further application considerations for each technology include limitations on the number of times a memory cell can be written or read before it deteriorates, how long it reliably retains data, its data storage density, how much energy it consumes, the need for integral mechanical devices such as for disk drives and tapes, and the complexity and expense of associated circuitry. Considering these limitations, there is now no ideal technology for general applications. Magnetic random access memory (MRAM) as described below appears to have properties that position it well for widely accepted digital memory applications, overcoming many of these limitations.

Spin electronics, which combines semiconductor technology and magnetics, i.e., which utilizes both the discrete electron charge and magnetic moment of electrons, is a relatively recent development in semiconductor memory devices. The spin of an electron, rather than the charge, is used to indicate the presence of a logic "1" or "0". One such spin electronic device is a resistive memory device referred to as a magnetic random access memory, which includes conductive lines usually positioned perpendicular to one another in different metal layers, the conductive lines sandwiching a magnetic stack which functions as a memory cell. The place where the conductive lines intersect is called a cross-point. A current flowing through one of the conductive lines generates a magnetic field around the conductive line and orients the magnetic polarity of one layer of the magnetic stack. A current flowing through the other conductive line induces a superimposed magnetic field and can partially turn the magnetic polarity, also. Digital information, represented as a "0" or "1", is storable in the alignment of magnetic moments in the magnetic stack. The resistance of the magnetic stack depends on the moment's alignment. The stored state is read from the magnetic stack by detecting the component's resistive state. An array of memory cells may be constructed by placing the conductive lines in a matrix structure having rows and columns, with the magnetic stack being placed at the intersection of the conductive lines.

A key advantage of MRAMs compared to traditional semiconductor memory devices, such as DRAMs, is that MRAMs are non-volatile upon removal of electrical power. This is advantageous because a personal computer (PC) utilizing MRAMs could be designed without a long "boot-up" time as with conventional PCs that utilize DRAMs, as an example. Moreover, MRAMs do not need to be rewritten when they are read. In addition, MRAMs have the potential for read/write speeds in the range of a few nanoseconds, which compares favorably with fast memory technologies now available.

Another application of magnetic tunnel junction cell cells is for galvanic decouplers (also called galvanic isolators). Galvanic decouplers are used in applications where dielectric isolation, i.e., the absence of a metallic connection, is required between two circuits that require a signal to be communicated from one to the other. When the signal to be communicated is digital, opto-isolators are frequently used, which are generally configured with a light-emitting diode transmitter and a diode (or transistor) receiver, separated by an intervening insulating medium. Opto-isolators are often limited in performance by a maximum data rate due in part to their ability to transmit one bit of data at a time. When substantial data must be communicated quickly, multiple opto-isolators are often required, which can consume valuable circuit-board space.

FIG. 1 illustrates a magnetic tunnel junction (MTJ) stack capable of registering (or storing, or being programmed with) one bit that comprises a resistive or magnetic memory cell. The terms "memory cell," "MTJ," "MTJ cell," and "MTJ stack" are used interchangeably herein and refer to the MTJ shown in FIG. 1. The MTJ comprises at least two ferromagnetic layers M1 and M2 that are separated by a tunnel layer TL. The MTJ stack is positioned at the cross-point of two conductors, referred to as a wordline WL and a bitline BL. One magnetic layer M1 is referred to as a free layer or a storage layer, and the other magnetic layer M2 is referred to as a fixed layer or a reference layer. Two publications describing the art of MRAMs are S. Tehrani, et al., "Recent Developments in Magnetic Tunnel Junction MRAM," IEEE Trans. on Magnetics, Vol. 36 Issue 5, September 2000, pp. 2752–2757, and J. DeBrosse, A. Bette et al., "A High Speed 128-kb MRAM Core for Future Universal Memory Applications," IEEE Journal of Solid State Circuits, Vol. 39, Issue 4, April 2004, pp. 678–683. The magnetic orientation of the free layer M1 can be changed by the superposition of the magnetic fields caused by a programming current IBL that is run through the bitline BL and a programming current IWL that is run through the wordline WL. A bit, e.g., a "0" or "1", may be stored (or "programmed") in the MTJ stack by changing the orientation of the field of the free magnetic layer relative to that of the fixed magnetic layer. If both magnetic layers M1 and M2 have the same orientation, the MTJ stack has a lower resistance RC. The resistance RC is higher if the magnetic layers have opposite magnetic orientations.

A free layer may be formed as a soft ferromagnetic layer or, alternatively, may be configured as a stack of more than one ferromagnetic layer, each ferromagnetic layer separated by an antiferromagnetic coupling spacer layer. Such an arrangement is referred to as a synthetic antiferromagnetic layer and is described in the publication M. Durlam, et al., A 0. 18 um 4 Mb Toggling MRAM, EDM 2003. In this publication, the alternative to configure the free layer as a synthetic antiferromagnetic layer is described.

FIG. 2 illustrates an MTJ configured as a memory cell of an MRAM device 10 from an array of MRAM devices, having a select transistor X1. In some MRAM array designs, the MTJ stack is combined with a select transistor X1, as shown in FIG. 2, which is a cross-sectional view of a 1T1MTJ design (one transistor and one MTJ. stack). The 1T1MTJ design uses the select transistor X1 for fast access of the MTJ during a read operation. A schematic diagram of the MTJ stack and select transistor X1 is shown in FIG. 3. A bitline BL is coupled to one side of the MTJ stack, and the other side of the MTJ stack is coupled to the drain D of the select transistor X1 by metal layer MX, via VX, and a plurality of other metal and via layers, as shown. The source S of the transistor X1 is coupled to ground (GND). X1 may comprise two parallel transistors that function as one transistor, as shown in FIG. 2. Alternatively, X1 may comprise a single transistor, for example. The gate G of the transistor X1 is coupled to a read wordline (RWL), shown in phantom, that is preferably positioned in a different direction than, e.g., perpendicular to, the bitline BL direction.

The select transistor X1 is used to access the memory cell's MTJ. In a read (RD) operation during current sensing, a constant voltage is applied at the bitline BL. The select transistor X1 is switched on, e.g., by applying a voltage to the gate G by the read wordline RWL, and current then flows through the bitline BL, the magnetic tunnel junction MTJ, over the MX layer, down the metal and via stack, through the transistor drain D, and through the transistor X1 to ground GND. This current is then measured and is used to determine the resistance of the MTJ, thus determining the programming state of the MTJ. To read another cell in the array, the transistor X1 is switched off, and the select transistor of the other cell is switched on.

The programming or write operation is accomplished by programming the MTJ at the cross-points of the bitline BL and the programming line or write wordline WWL using selective programming currents. For example, a first programming current IBL passed through the bitline BL causes a first magnetic field component in the MTJ stack. A second magnetic field component is created by a second programming current IWL that is passed through the write wordline WWL, which may run in the same direction as the read wordline RWL of the memory cell, for example. The superposition of the two magnetic fields at the MTJ produced by programming currents IBL and IWL causes the MTJ stack to be programmed. To program a particular memory cell in an array, typically a programming current is run through the write wordline WWL, which creates a magnetic field at all cells along that particular write wordline WWL. Then, a current is run through one of the bitlines, and the superimposed magnetic fields switch only the MTJ stack at the cross-point of the write wordline WWL and the selected bitline BL.

Current sensing may be used to detect a resistance change of resistive memory cells. Current sensing is the desired method of sensing the state of MRAM cells, for example. In current sensing, a voltage is applied to the bitline, and the bitline voltage is kept constant with a sense amplifier. The cell current is directly measured, with the cell current being dependent on the resistance of the memory cell being read. The use of current sensing reduces the capacitive load problem from long bitlines that may occur in voltage sensing because the voltage of the sensed lines is held constant, thereby avoiding altering charge in the different interconnection capacitances of different memory cells.

However, a limitation of a magnetic tunnel junction cell as described above is its ability to be programmed with only a single bit of information, a limitation shared with memory elements that are based on charge storage such as a DRAM or on switching transistor pairs such as in a static RAM (SRAM). This one-bit limitation of magnetic tunnel junction cells arises from the two stable magnetic orientations of its free magnetic layer, whereby one orientation is utilized to represent a "0", and the other, a "1". The origin of this limitation is the variation of magnetic energy associated with the magnetic tunnel junction cell depending on the orientation of the direction of the free magnetic layer. Magnetic energy minima for the field orientation of the free magnetic layer occur in two directions that are substantially 180 degrees apart, with energy maxima at 90 and 270 degrees. The "0" and "1" memory states utilize the two energy minima for the data storage. The energy maxima represent unstable states, and the energy difference between a stable state and an intervening unstable state is a measure of data storage reliability, i.e., of the resistance to data loss caused by the random, thermal energy ("Boltzmann energy") of the freely orientable magnetic layer that is proportional (via Boltzmann's constant) to the absolute temperature of the device.

To achieve a high storage density, an alternative to storing multiple bits of information per cell is to decrease the feature sizes of the cells so as to increase the physical cell density. However, the activation energy of a cell varies as the cell volume, and consequently, with a small energy barrier inherently associated with small cells, random loss of data can occur in cells that are too small due to the stochastic processes associated with ordinary thermal effects. A memory design for a substantial quantity data that can reliably retain every bit for 10 years or more without thermally induced random data loss preferably requires an energy barrier between stable states of at least 200 $k_B T$ (or about 5 eV at room temperature) where $k_B$ is Boltzmann's constant and T is the absolute operating temperature of the device.

Thus, to be programmed with more than one bit in a single memory cell a technique is required for creating more than two energy minima associated with the magnetization direction of the free magnetic layer so that more than one bit of information can be programmed in a single magnetic tunnel junction cell. To program two bits in one cell, at least four energy minima are required coupled with a process for enabling a transition from any energy minimum to any other energy minimum so that the two bits to be programmed can be freely chosen. Sufficiently high intervening energy maxima, i.e., sufficient activation energies, are required to preserve the data reliability, which generally requires significant anisotropy for the free magnetic layer.

The devices described herein with a resistance dependent on a programmed state of a free magnetic layer are preferably based on the tunneling magnetoresistance effect (TMR), but, alternatively, may be based on other magnetic-orientation dependent resistance effects such as the giant magnetoresistance effect (GMR) or other magnetic-orientation dependent resistance effects relying on the electron charge and its magnetic moment. The programmable resistance devices described herein will generally be described as TMR devices with a resistance dependent on its programmed magnetic state, but other devices based on the GMR or other effects wherein a resistance is dependent on its magnetically programmed state may be readily substituted for the TMR devices within the broad scope of the present invention.

SUMMARY OF THE INVENTION

In one aspect, the present invention relates to utilizing the resistance characteristics of MTJ devices, including devices based on GMR or another mechanism in which a resistance is dependent on the direction of polarization of a free magnetic layer with respect to at least two fixed magnetic layers, that can exhibit at least four distinct resistance values dependent on the magnetic orientation of a magnetic layer so that at least two bits of data can be stored and read. In response to the diminishing activation energy of an MTJ cell as the cell volume is decreased with the utilization of extremely small feature sizes, the present invention provides an MRAM device capable of storing a plurality of bits of information in a single cell. Thereby the design and efficient manufacture of high density and low cost MTJ memory devices is enabled.

Embodiments of the present invention achieve technical advantages by configuring an MTJ device with two fixed layers with a magnetic orientation of one fixed layer at an angle with respect to the magnetic orientation of the other fixed layer, and with orientations of the fixed magnetic layers that are neither parallel nor antiparallel. Preferably, the angle between the magnetic orientations of the fixed layers is 90 degrees. In a further embodiment, the fixed layers are ferromagnetic layers formed as thin films on an insulating surface. In a further embodiment an antiferromagnetic layer is formed adjacent to each fixed layer. In a further embodiment a free ferromagnetic layer is formed between the fixed layers and is separated from each fixed magnetic layer by an insulating layer. Preferably, the free ferromagnetic layer is formed with a soft ferromagnetic material. Preferably, the free ferromagnetic layer exhibits four stable magnetic orientations. In an embodiment of the present invention the free layer is configured as a synthetic antiferromagnetic layer including multiple antiferromagnetically coupled layers of a ferromagnetic material with an antiferromagnetic coupling spacer layer between each antiferromagnetic layer. Preferably, the thickness of each insulating layer is chosen to provide distinguishable resistances for the MTJ stack depending on the orientation of the free magnetic layer so that the stable orientations of the free magnetic layer can be uniquely sensed from the MTJ stack resistance. The thickness of one insulating layer is preferably greater than the thickness of the other to provide distinguishable resistances. Alternatively, one insulating layer is formed with a material composition different from that of the other to provide distinguishable resistances. Preferably the MTJ is formed in a lobed pattern with even symmetry. In a further embodiment bit lines, word lines and read word lines are formed adjacent to an array of MTJ cells so that individual MTJ cells in an array can be programmed and read. Preferably, to program an MTJ stack, the bit lines and word lines are driven with controlled currents of sufficient magnitude and duration to selectively reorient the direction of the magnetic field of the free layer. Preferably, a sense amplifier capable of distinguishing at least four resistance states is configured to read the cell data. Preferably, the sense amplifier is a current sense amplifier.

In accordance with another preferred embodiment of the present invention a magnetic random access memory device is configured with an array of MTJ cells, each cell including two fixed layers with a magnetic orientation of one fixed layer at an angle with respect to the magnetic orientation of the other fixed layer, and that the orientations of the fixed magnetic layers are neither parallel nor antiparallel. Preferably, the angle between their magnetic orientations in the individual cells is 90 degrees. In a further embodiment, the fixed layers of the cells of the magnetic random access memory device are ferromagnetic layers formed as thin films on an insulating surface. In a further embodiment an antiferromagnetic layer is formed in the magnetic random access memory device adjacent to each fixed layer. In a further embodiment a free ferromagnetic layer is formed between the fixed layers and is separated from each fixed magnetic layer by an insulating layer. Preferably, the free ferromagnetic layer exhibits four stable magnetic orientations. And preferably, the thickness of each insulating layer is chosen to provide distinguishable resistances for each MTJ stack depending on the orientations of the free magnetic layers so that the stable orientations of the free magnetic layers can be uniquely sensed from each MTJ stack resistance. Preferably, in each cell the thickness of one insulating layer is greater than the thickness of the other. Alternatively, one insulating layer in each of the cells is formed with a material composition different from the other insulating layer of the other cells. In an embodiment of the present invention the free layer is formed as a synthetic antiferromagnetic layer. In a further embodiment, the free layer is configured as a synthetic antiferromagnetic layer including multiple antiferromagnetically coupled layers of a ferromagnetic material with an antiferromagnetic coupling spacer layer between each antiferromagnetic layer. Preferably each MTJ is formed in a lobed pattern with even symmetry. In a further embodiment an array of bit lines, word lines and read word lines are formed adjacent to the array of MTJ cells so that individual MTJ cells in the array can be programmed and read. Preferably, to program each MTJ stack in the array, the corresponding bit lines and word lines are driven with controlled currents to selectively reorient the direction of the magnetic field of the free layer in the selected cell. Preferably, a sense amplifier capable of distinguishing at least four resistance states is configured to read the data in a selected cell. Preferably, the sense amplifier is a current sense amplifier.

Another embodiment of the present invention is a method of configuring an MTJ device by forming two fixed layers with a magnetic orientation of one fixed layer at an angle with respect to the magnetic orientation of the other fixed layer, and with orientations of the fixed magnetic layers neither parallel nor antiparallel. Preferably, the method includes forming the angle between the magnetic orientations at 90 degrees. In a further embodiment, the method includes forming the fixed layers as thin film ferromagnetic layers on an insulating surface. In a further embodiment the method includes forming an antiferromagnetic layer adjacent to each fixed layer. In a further embodiment the method includes forming a free ferromagnetic layer between the fixed layers and separating it from each fixed magnetic layer by an insulating layer. Preferably, the method includes forming the free ferromagnetic layer using a soft ferromagnetic material. Preferably, the method includes configuring the free ferromagnetic layer so that it exhibits four stable magnetic orientations. And preferably, the method includes choosing the thickness of each insulating layer to provide distinguishable resistances for the MTJ stack depending on the orientation of the free magnetic layer so that the stable orientations of the free magnetic layer can be uniquely sensed from the MTJ stack resistance. Preferably, the method includes forming the thickness of one insulating layer greater than the thickness of the other. Alternatively, the method includes forming one insulating layer with a material composition different from that of the other. The method includes forming the free layer as a synthetic antiferromagnetic layer. In an embodiment of the present invention the method includes configuring the free layer as a synthetic antiferromagnetic layer including multiple antiferromagnetically coupled layers of a ferromagnetic material with an antiferromagnetic coupling spacer layer between each antiferromagnetic layer. Preferably the method includes forming the MTJ in a lobed pattern with even symmetry. In a further embodiment the method includes placing bit lines, word lines and read word lines adjacent to an array of MTJ cells so that individual MTJ cells in an array can be programmed and read. Preferably, to program an MTJ stack, the method includes driving the bit lines and word lines with controlled currents to selectively reorient the direction of the magnetic field of the free layer. Preferably, the method includes configuring a sense amplifier to distinguish at least four resistance states so as to read cell data. Preferably, the method includes configuring the sense amplifier as a current sense amplifier.

Embodiments of the present invention achieve further technical advantages by configuring a galvanic isolator using an MTJ cell with at least four stable states. The MTJ cell is configured with magnetic and insulating layers as described hereinabove, and configured further to transmit at least two bits of data across a dielectric isolation boundary by providing at least four distinguishable resistive states. In such an arrangement at least two non-parallel current-carrying conductors that are dielectrically isolated from the MTJ cell are positioned and oriented in non-parallel directions so that the cell can be programmed with at least two bits of data. The resistance of the cell is sensed with a sense amplifier. Preferably, the current-carrying conductors are dielectrically isolated from the sense amplifier. Preferably, the cell is an MTJ cell, but other magnetic resistance memory cells may be used. Preferably, the cell resistance is sensed by applying a voltage to the cell and sensing the cell current with a current sensing amplifier. Alternative cell resistance sensing arrangements may be used, such as, voltage sensing by applying a current to the cell and sensing the cell voltage with a voltage sensing amplifier.

Another embodiment of the present invention is a method of configuring a galvanic isolator using an MTJ cell with at least four stable states, and forming magnetic and insulating layers as described hereinabove to transmit at least two bits of data across a dielectric isolation boundary by providing at least four distinguishable resistive states. The method includes locating at least two non-parallel current-carrying conductors that are dielectrically isolated from the MTJ cell and positioning and orienting them in non-parallel directions so that the cell can be programmed with at least two bits of data. The method further includes sensing the resistance of the cell with a sense amplifier. Preferably, the method includes dielectrically isolating the current-carrying conductors from the sense amplifier. Preferably, the method further includes configuring the cell as an MTJ cell, or alternatively, configuring the cell with another magnetic memory cell technology in which a resistance is dependent on the programmed magnetic orientation of a layer. Preferably, the method includes sensing the cell by applying a known voltage to the cell and sensing the current with a current sensing amplifier. Alternatively, the method includes sensing cell resistance by applying a known current to the cell and sensing the cell voltage with a voltage sensing amplifier.

In the circuit descriptions herein, a transistor may be configured as multiple transistors coupled in parallel, or vice versa, without departing from the scope of the present invention.

Embodiments of the present invention achieve technical advantages as a memory device including MTJ cells each storing a plurality of bits of information. Advantages of embodiments of the present invention include a memory device with increased memory density and reduced manufacturing cost, that is non-volatile upon removal of electrical power, and that does not require its data to be re-written after it has been read.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Embodiments of the present invention will be described with respect to preferred embodiments in a specific context, namely a FET MRAM device configured to store (or be programmed with) a plurality of bits. The invention may be applied to resistive memory devices and other memory devices that include a plurality of current sense amplifiers and reference current sources to detect the resistive state of memory cells configured to store a plurality of bits.

In resistive memory devices such as MRAMs, even in MRAMs storing only one bit, a current sensing circuit including a reference current source may be used to detect the programmed state of a memory cell based on the cell resistance. A current sense amplifier scheme 11 is shown in the prior art drawing of FIG. 4a. Shown is an example for a current sensing scheme 11 for a 1T1MTJ memory cell configured to store one bit using averaging of two reference cells RC1 and RC2 to produce a reference current at the inverting input of the current sense amplifier 12. The current sensing scheme 11 comprises a current sense amplifier 12 and a column selector 14 coupled to a memory array 16. The FETs illustrated on FIG. 4a are N-channel devices.

Figure 4A:
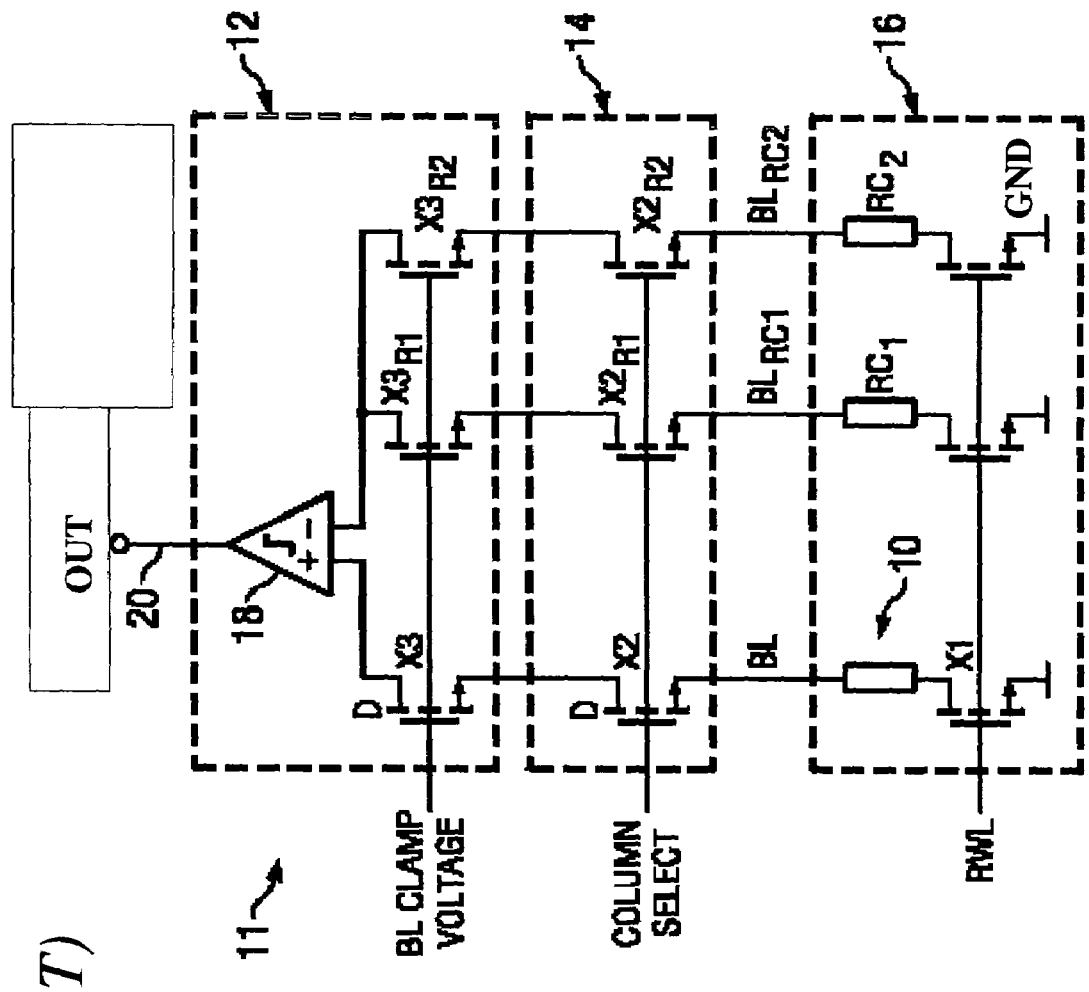
FIG. 4a is a schematic of an MRAM cell current sensing circuit that averages the current of two reference cells.

Only one MTJ 10 is shown in the drawing of FIG. 4a; however, there may be hundreds or thousands or more MTJs in the array 16 to form a bulk memory device. The reference cells RC1 and RC2 preferably reside in the array with the memory cells 10, but the reference cells RC1 and RC2 may alternatively reside in another array 16, for example. Reference cell RC1 may comprise a cell programmed as a logic 1, and reference cell RC2 may comprise a cell programmed as a logic 0, for example. Each bitline BL containing a memory cell 10 is connected to at least one column select transistor X2 of the column selector 14. The column selector 14 is connected to the sense amplifier 12. The bitline clamp transistor X3, a source follower with its gate coupled to the bitline (BL) clamp voltage, is coupled to a multiplexer (not shown) that is coupled to a plurality of other memory cells, each via a column select transistor (also not shown). Cell 10, RC1 and RC2 are located on bitlines selected by the column selector 14. These cells are shown as examples for cells on the bitlines. Since the resistance of the memory cell 10 is preferably substantially greater than the ON resistance of the series FET switches such as source follower X3, source follower X3 effectively clamps the memory cell voltage to the BL clamp voltage minus approximately its FET threshold voltage. Memory cell voltage during a read operation is typically about 200–300 mV for an MRAM operating from a 1.8 V bias voltage source (not shown), but may be lower or higher in other applications.

As current sensing is used in FIG. 4a, the selected bitlines are kept at a constant potential by bitline clamping transistors X3 during a read operation. The current comparator 18 compares the currents of the selected memory cell 10 with the averaged current of reference cells RC1 and RC2, with current scaling as required to form the averaged current. The level of the reference cell current is arranged to produce the approximate midpoint between the current of a selected cell with a logic "0" state and a selected cell with a logic "1" state, in MRAM applications. Alternatively, the current sense amplifier 12 may use only one reference cell, not shown, in other applications.

A read wordline RWL is coupled to the gate of the select transistor X1 of the selected cell 10. If the read wordline RWL is activated, then all of the select transistors X1 in that row of the memory array 16 are switched on. The column select transistor X2 of the column selector 14 is used to select the correct bitline BL (e.g., the column of the selected memory cell 10). The column selector 14 switches the bitline BL of the selected cell to the direction of the sense amplifier 12. The current sense amplifier 12 reads the resistive state of the selected cell 10 by measuring the cell current. The current sense amplifier 12 comprises a current comparator 18 coupled to transistor X3 and transistors X3R1 and X3R2 of the reference paths for reference cells RC1 and RC2. The current sense amplifier 12 maintains a constant bitline BL voltage during a read operation, using the source-follower clamping transistors X3, X3R1 and X3R2 that are coupled to the signal "BL clamp voltage." The current comparator 18 compares the current through transistor X3 of the selected cell 10 with the average of the currents through X3R1 and X3R2 of the reference cells, to determine the resistive state of selected cell 10, which information is output (indicated by "OUT") as a digital or logic "1" or "0" at node 20 of the current sense amplifier 12.

Figure 4B:
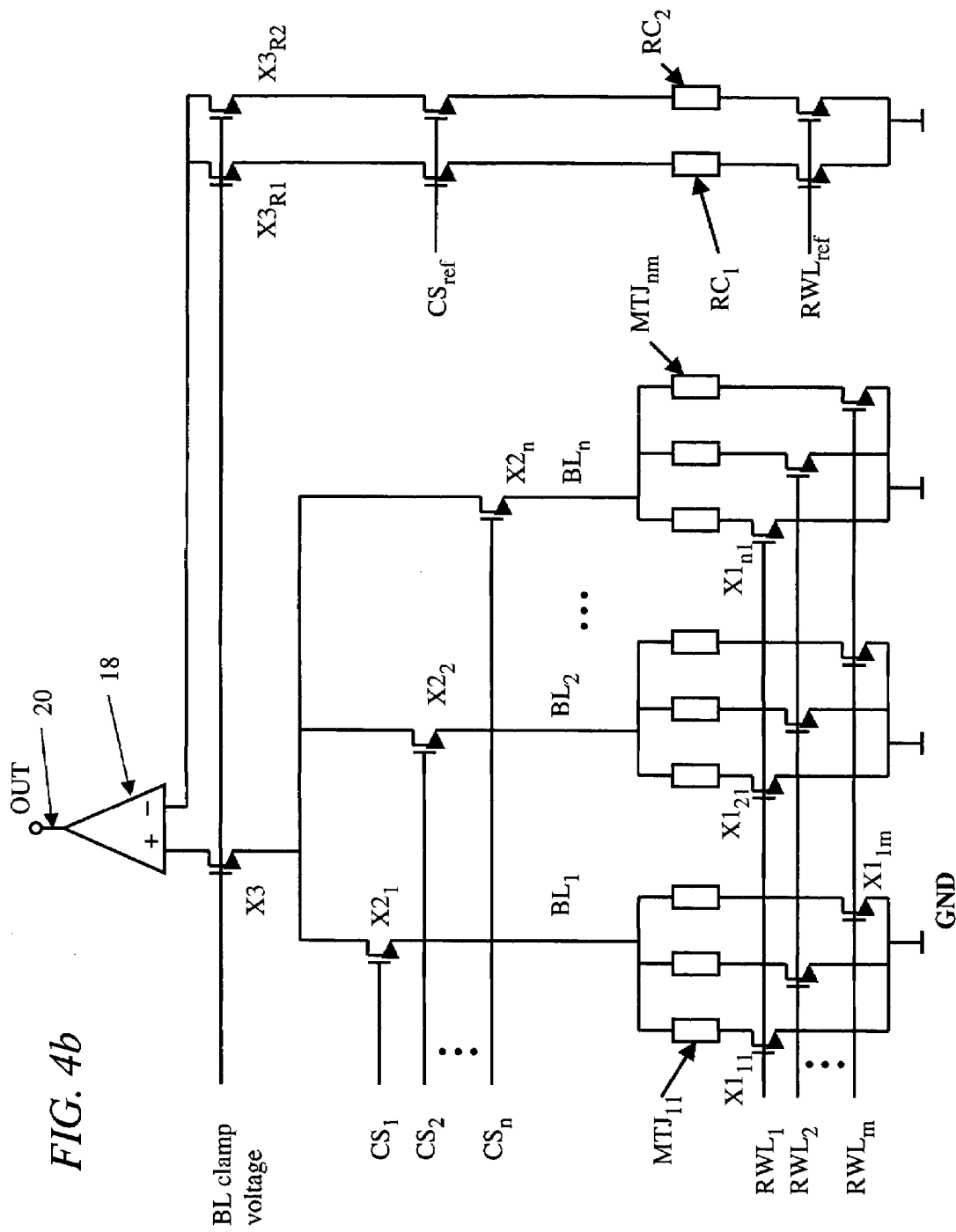
FIG. 4b is a schematic of an array of memory cells and two reference cells coupled to a current sensing circuit.

Referring now to FIG. 4b, illustrated is an array of memory cells MTJ11 . . . MTJnm to form an MRAM device in accordance with an embodiment of the present invention. Components that are the same as those illustrated on FIG. 4a will not be re-described in the interest of brevity. The current comparator 18 includes a non-inverting and an inverting input, and an output node 20 that indicates a logic state of a selected memory cell. Source followers X3, X3R1, and X3R2 clamp the voltage of the selected memory cell and the voltage of the two reference cells RC1 and RC1.

The memory cell to be sensed is determined by a memory cell address supplied from an external source (not shown) that is decoded to enable one of column select signals CS1, . . . , CSn and one of read wordline signals RWL1, . . . , RWLm. The switches RWLref are included to provide symmetry in the circuit for the reference cells RC1 and RC2. The enabled column select signal in turn selects one of bitlines BL1, . . . , BLn. The plurality of wordlines may be physically arranged in parallel proximate one side of the memory cells. The plurality of bitlines may also be physically arranged in parallel, and proximate another side of the memory cells. Correspondingly, one of transistors X21, . . . , X2n and one of transistors X111, . . . , X1n1 are enabled to conduct, selecting thereby a particular memory cell to be sensed. Logic circuits to convert a memory cell address to a particular column select signal and a particular read wordline signal are well known in the art and will not be described further.

A current sense amplifier including the current comparator 18, the column selector including switches CS1, . . . , CSn, and switches CSref, and the clamping circuit including source followers X3, X3R1, and X3R2 form a current sensing circuit as described hereinabove with reference to FIG. 4a. Thus FIG. 4b illustrates an arrangement to sense a selected memory cell in an array of memory cells for comparison with the state of two reference cells using averaging of currents of the two reference cells RC1 and RC2 to produce a reference current at the inverting input of the current comparator 18.

Figure 5:
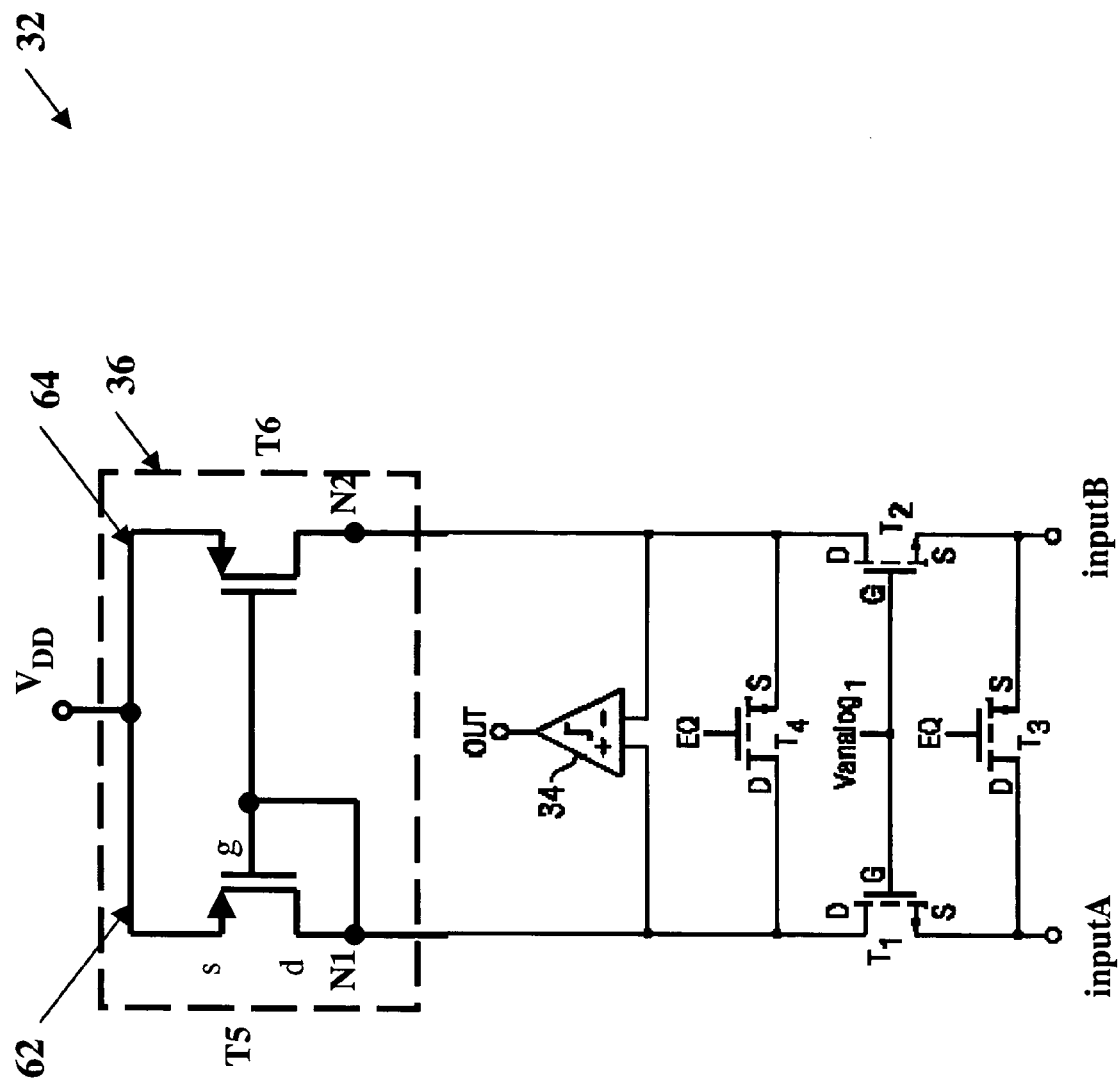
FIG. 5 shows a one-bit current sense amplifier that includes a voltage comparator, bitline clamping devices, and an illustrative current mirror for comparing a memory cell current to a reference current.

The sensing of resistance of an MTJ will now be further described with reference to FIG. 5 in which a current mirror, 36, and a voltage comparator, 34, are used to sense the resistance of an MTJ cell. From the MTJ resistance one infers whether a "0" or a "1" was stored, even for a plurality of bits stored in a single cell as described in a later section hereinbelow. Illustrated in FIG. 5 is a current sense amplifier 32 in accordance with an embodiment of the present invention that includes the voltage comparator 34. The current sense amplifier is configured to compare input currents coupled to inputs inputA and inputB. The drains of bitline clamping devices T1 and T2, which preferably comprise transistors, are coupled to the non-inverting and inverting inputs, respectively, of the voltage comparator 34. The sources of transistors T1 and T2 are connected to a first input signal node inputA and a second input signal node inputB, respectively, as shown. Assume that inputB is connected to the selected memory cell by a column selector signal (signal COLUMN SELECT in FIG. 4, or signals CS1, CS2, . . . ,CSn in FIG. 4b), and that inputA is connected to reference cells producing an average mid-current reading of a "0" and "1" logic memory state. The reference cell current is coupled, for example, to inputA and is mirrored from transistor T5, and creates a drain-source voltage at transistor T5. Alternatively, inputA may be coupled to a memory cell storing the opposite logic state of the selected memory cell. Clamping transistors T1 and T2 as illustrated on FIG. 5 are N-channel source followers, although other circuit arrangements and other transistor types may be used to clamp a memory cell voltage. The gates of transistors T1 and T2 are connected to a reference voltage Vanalog1 that is preferably configured to provide a bitline clamp voltage as described hereinabove with reference to FIG. 4. Reference voltage Vanalog1 (corresponding to "BL clamp voltage" on FIG. 4) may comprise a voltage level of about 0.7 volts to produce a memory cell voltage of about 200–300 mV, for example, considering FET threshold voltage, although reference voltage Vanalog1 may alternatively comprise other voltage levels.

With reference to FIG. 5, illustrated is a current sense amplifier 32 configured to sense one bit. Included in the current sense amplifier 32 are optional transistor switches T3 and T4, which function as voltage equalizing devices. For example, the source of transistor T3 may be coupled to signal inputB, the drain of transistor T3 may be coupled to signal inputA, the source of transistor T4 may be coupled to the inverting input of the voltage comparator 34, and the drain of transistor T4 may be coupled to the non-inverting input of the voltage comparator 34. The gates of transistors T3 and T4 are coupled to an equalization signal EQ. Before a read operation is initiated, transistors T3 and T4 are activated to ensure that the input signal nodes, inputA and inputB, are at the same potential (i.e., equalized), and also to ensure that the inputs of the comparator 34 are equalized at the same potential. Transistors T3 and T4 are turned off after a short delay after the bitlines are connected and the memory cells are ready to be read. Connecting bitlines ordinarily causes some transient disturbance in the circuit.

The current sense amplifier 32 includes a current mirror 36 preferably comprised of P-channel transistors with drains coupled to the inputs of the voltage comparator 34. The current mirror includes a first transistor T5 coupled between a bias voltage source VDD and clamping device T1, and a second transistor T6 coupled between the bias voltage source VDD and clamping device T2. An exemplary voltage for the bias voltage source VDD is 1.8 volts, but lower (or higher) voltages may be used in future or other designs. The gates of transistors T5 and T6 are coupled together and to the drain of transistor T5. The transistor T5 is configured as a transistor diode. Transistor T6 is thus configured as a transistor current source.

In a transistor diode configuration, if the gate of a transistor, e.g., transistor T5, is connected to the drain, and a current is applied to the drain, then a voltage is developed at the drain, and the transistor exhibits diode-like behavior. A current applied at inputA passes through the drain of transistor T5, which is connected to the gate of transistor T5, creating a voltage potential between the drain and source of transistor T5. There is no ohmic, linear load, as in a resistor; rather, the behavior is somewhat similar to that of a diode, which exhibits a non-linear voltage-current characteristic.

On side 62, the drain-to-source voltage of transistor T1 is substantially variable in the sense that this voltage difference is essentially "self-adjusting" to make up the difference between the drain voltage of transistor T5 (at node N1) and the roughly 200–300 mV potential at current-sense input, inputA. However, on side 64, the drain-to-source voltage of transistor T6, which operates in current saturation with its gate voltage determined by transistor T5, is greatly dependent on its drain-to-source current that, after an initial transient, must substantially equal the drain-to-source current of transistor T2. Thus the steady-state drain-to-source current of transistor T6 is substantially determined by the input current at inputB because transistors T3 and T4 are disabled to conduct during the MTJ measurement time. Thus the unequal cell currents from inputA and inputB are converted to a large voltage difference that is coupled to the inputs of comparator 34, particularly by the drain-to-source voltage of transistor T6. The voltage comparator 34 senses the substantial voltage difference resulting from the small difference of currents from inputA and inputB.

Thus if the inputB current is only slightly higher than the inputA current, a large voltage shift at the inverting input of the voltage comparator 36 is created because no substantial current flows into the input terminals of the voltage comparator 34. If additional current is applied at the drain of a transistor in current saturation, a small shift of this current creates a large shift in the drain-source voltage, resulting in a large voltage amplification. This amplified voltage is sensed by the inverting input of the voltage comparator 34. Thus a large voltage difference is advantageously created between the inverting and non-inverting inputs of the voltage comparator 34, even when the current difference between inputA and inputB is small.

Preferably, transistors T5 and T6 have the same dimensions, the same geometry and the same orientation, and comprise the same type of transistors when equal scaling is required for the input currents, inputA and inputB. Moreover, as is well understood in the art, the currents in a current mirror may be scaled as may be required for a particular circuit design by scaling the areas of the respective transistors to produce a scaled current mirror leg current. Preferably, the operating conditions of both transistors T5 and T6 should be similar (or scaled) to achieve ideal (or scaled) current mirroring performance.

Transistors T5 and T6 thus amplify the voltage difference at the first and second input, inputA and inputB, of the voltage comparator 34 producing a substantial output voltage at the node "OUT" representing a logic state of the selected memory cell. Thus small differences in currents can be detected in the sides 62 and 63 of the current sense amplifier due to small changes in memory cell resistance as it depends on the state of the memory cell. Transistors T5, T6, T7 and T8 preferably comprise PMOS transistors, and alternatively may comprise NMOS transistors, as examples. Optional equalization switches T3 and T4 may be included in the current sense amplifier and placed directly at inputA and inputB and at the non-inverting and inverting inputs of the comparator stage 34 of the sense amplifier 32.

The current sense circuit illustrated in FIG. 5 is configured to apply equal voltages to the memory cells by means of the clamp transistors, thereby avoiding altering the charge of unknown parasitic capacitance external to the current sense amplifier, and to provide high sensitivity to small changes in the sensed resistance of a memory cell by means of a current mirror coupled to the drains of the source follower clamps.

The accuracy of the current mirror 36 illustrated in FIG. 5 may be improved by stacking an additional, optional cascode device in series with transistor T6. Co-pending application Ser. No. 10/326,367, as previously referenced and incorporated herein, describes circuit techniques to include a cascode device with the current mirror. A cascode device may be included in the circuit to establish similar operating conditions in the current mirror transistors on both sides thereof, thereby improving its accuracy and capacitive behavior. Thus, a sense amplifier including a cascode device can provide current-sensing speed advantages.

The current sense amplifiers as described above depend for their memory sensing operation on a reference current source that is configured using one or two MTJ cells. The accuracy and reliability of current sources can be improved as described in co-pending application Ser. No. 10/982,026, entitled "Reference Current Source for Current Sense Amplifier and Programmable Resistor Configured with Magnetic Tunnel Junction Cells."

The MTJ shown in FIG. 4 in conjunction with a current-sensing scheme such as the current sensing arrangement 11 shown in FIG. 5 is disadvantageous in that only one bit of information is stored in each MTJ cell, and there is an inherent lower limit to cell size as described above, because activation energy (which protects data integrity) is proportional to cell volume. The storage of one bit is dependent, as described above with reference to FIG. 1, on the two stable alignments of the magnetic orientation of the free layer with the respect to the fixed layer. The two stable field orientations produce the two resistances of the MTJ stack that can be sensed during a read operation.

Figure 6:
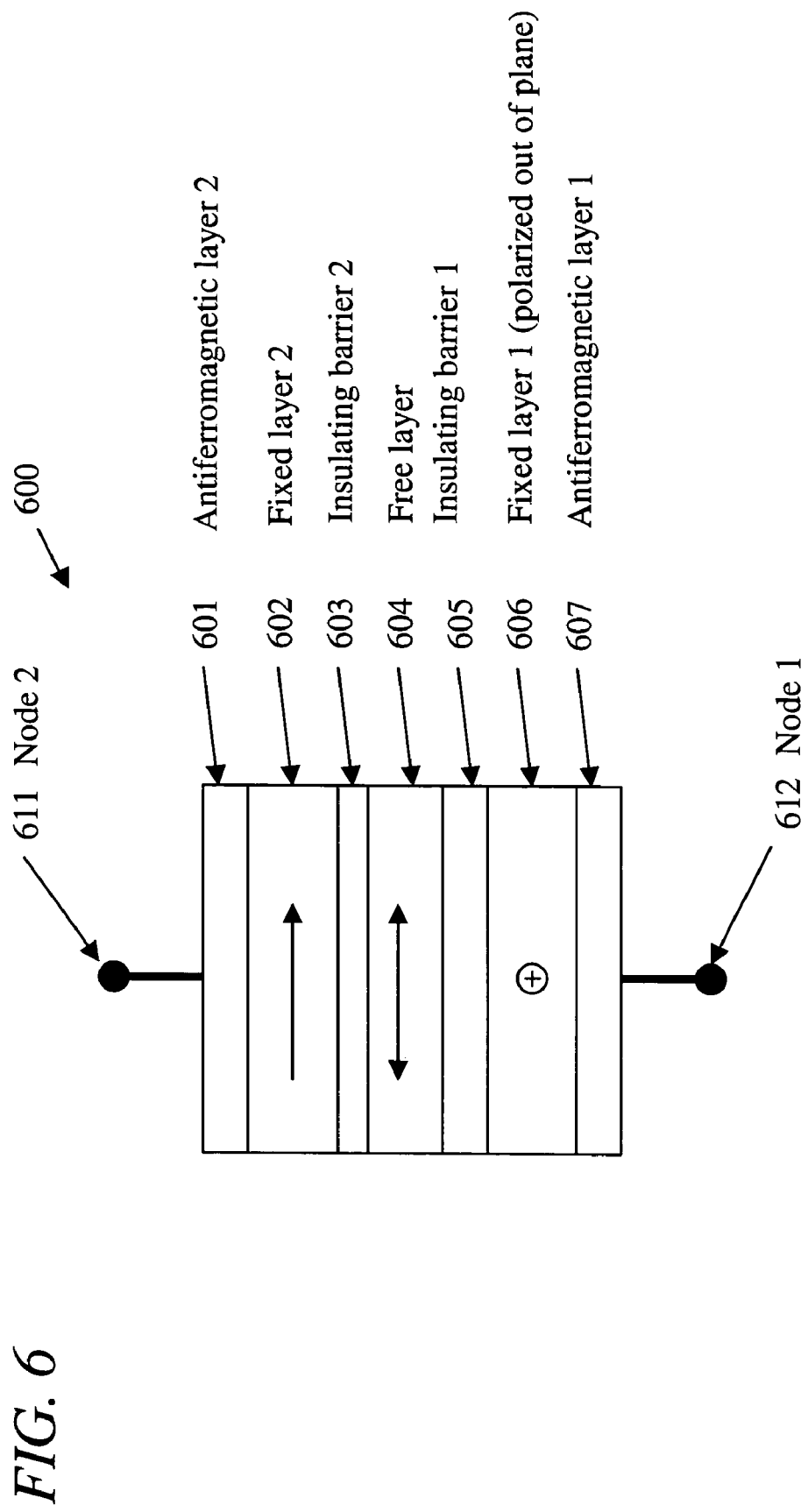
FIG. 6 shows a cross-section view of a MTJ configured to store two bits.

To resolve the limitation of storing one bit per MTJ cell, an MTJ may be configured with a second fixed ferromagnetic layer. Referring now to FIG. 6, illustrated is a cross-sectional view of an MTJ stack 600 configured in accordance with the present invention to store two bits of data utilizing two fixed ("reference") magnetic layers 602 and 606. The lower fixed magnetic layer 606 is a ferromagnetic layer that is preferably formed above an associated antiferromagnetic layer 607, which in turn is deposited over a bottom contact represented by 612, Node 1, above an insulating layer or substrate such as silicon dioxide. The upper antiferromagnetic layer 601 is formed with an upper contact represented by 611, Node 2. The lower fixed magnetic layer (or the upper fixed layer, 602) may include a second ferromagnetic layer, or may be a thicker layer without an adjoining antiferromagnetic layer. Deposition of either layer can be accomplished by vacuum or chemical vapor deposition or other deposition method as is well understood in the art. The fixed layer 606 is a hard magnetic layer requiring substantial coercivity to magnetize or demagnetize it or to change its magnetic orientation. The antiferromagnetic layer 607 is included to help retain, i.e., "pin," the magnetization of the fixed layer 606. Antiferromagnetic materials such as metallic manganese and chromium and some transition metal oxides are characterized by uncompensated electron spins that orient themselves to neutralize an external magnetic field. Their presence in the MTJ stack is included to help preserve the magnetization of the adjoining hard magnetic layer. The magnetization of the fixed layer 606 may be accomplished by annealing in a DC magnetic field. Preferably the ferromagnetic layer 606 may be formed as a film of materials such as Co, Fe, Ni, or alloys thereof, or alloys of these elements with other elements, preferably deposited approximately 2–10 nm in thickness, and the antiferromagnetic layer 607, as a film of materials such as PtMn, IrMn, or alloys of these elements with other elements preferably deposited approximately 2–10 nm in thickness. The magnetic orientation of the layer 606 is illustrated on FIG. 6 to be directed into the plane of the figure by the cross hairs in the small circle in the drawing.

Above the fixed layer 606 are two tunneling, insulating layers 605 and 603, and between them is a free magnetic layer 604. This layer is formed of a soft magnetic material, i.e., a material that requires a lower coercivity (a smaller H-field) to change its magnetization. The two tunneling, insulating layers preferably are configured with different thicknesses or with different material compositions as described below to provide distinguishable resistances for the MTJ stack as a function of the stable magnetic orientations of the free layer. In FIG. 6 the insulating layer 605 is shown thicker than the insulating layer 603. The free magnetic layer 604 is constructed with axial anisotropy, i.e., it has preferred, antiparallel directions of easy magnetization. The free magnetic layer is deposited (e.g., vacuum or chemical vapor or other film deposition process) with sufficiently thin thickness, preferably about 2–5 nm, so that it magnetizes as a single Weiss domain. The deposition of the free layer may be performed with an applied magnetic field parallel to the plane of the film to provide an axial anisotropy. Alternatively, the alignment of the crystal axes, such as depositing 011 cubic, may be chosen to provide a magnetic anisotropy.

The fixed layer 602 is another hard magnetic layer deposited above the tunneling, insulating layer 603. An antiferromagnetic layer 601 is deposited adjacent to the fixed layer 602, and serves the same magnetization maintenance purpose for the layer 602 as the antiferromagnetic layer 607 does for the fixed layer 606. However, the two antiferromagnetic layers 601 and 607 are formed with different setting temperatures. Generally, the antiferromagnetic layers are set by an annealing process. The reference layers are oriented in a strong magnetic field that imposes its magnetization direction on the local structure of the antiferromagnetic layer. That structure is then set when cooled in the applied field. By annealing the hard layers at different temperatures with an externally applied DC magnetic field of sufficient magnitude that is first aligned in one direction at a higher temperature, and then in another direction substantially normal to the first direction at a lower temperature, remanent magnetizations of the two hard layers can be obtained that are substantially normal to each other after cooling the device below both Curie points. The externally applied DC magnetic field should be parallel to the planes of the layers, and preferably is approximately 800,000 A/m.

As described above with respect to FIG. 1, the resistance of an MTJ stack depends on the relative magnetic orientation of a free magnetic layer with respect to the magnetic orientation of a fixed magnetic layer. Resistance to current tunneling through the insulting barrier separating the two layers, which can be readily sensed, depends on the relative magnetic orientations of the free and fixed layers. When there are two fixed layers with different directions of magnetization, preferably orthogonal, and two insulating layers, preferably with different thicknesses as illustrated on FIG. 6 or with different material compositions, four distinguishable resistances can be observed associated with four stable magnetic orientations of the free layer. Preferably, the fixed magnetic layers are pinned to adjoining antiferromagnetic layers. The resistance of the MTJ stack, e.g., the stack illustrated in FIG. 6, can be thought of as the sum of the variable resistance of each insulating layer plus the remaining fixed resistance of the stack. The sum of the variable portion of resistances $\Delta R(\vartheta)$ of the insulating layers may be represented by the equation $$\Delta R(\vartheta) = \Delta R_1 \cdot \cos(\vartheta) + \Delta R_2 \cdot \sin(\vartheta)$$

where $\Delta R_1$ is the resistance of the sequence of layers 601,602, 603, 604, $\Delta R_2$ is the resistance of the sequence of layers 604,605, 606, 607, and $\vartheta$ is an angle representing the orientation of the free magnetic layer.

If $\Delta R1$ is chosen to be $3 \cdot \Delta R2$, i.e., the first insulting barrier has three times the resistance of the second insulting barrier, then one obtains four equally spaced resistance values with increments $3 \cdot \Delta R2$, $\Delta R2$, $-\Delta R2$, and $-3 \cdot \Delta R2$ for the field orientations $0$, $\pi/2$, $\pi$, and $3\pi/2$ as the free layer is rotated to its stable field orientations. These resistance values can be used to represent the four memory states 11, 10, 01, and 00. The resistance of an insulating layer can be adjusted by changing its thickness, which affects its tunneling characteristics, generally as a nonlinear function of its thickness as is well understood in the art. Alternatively, the resistance of an insulating layer can be adjusted by altering its composition.

Figure 7A:
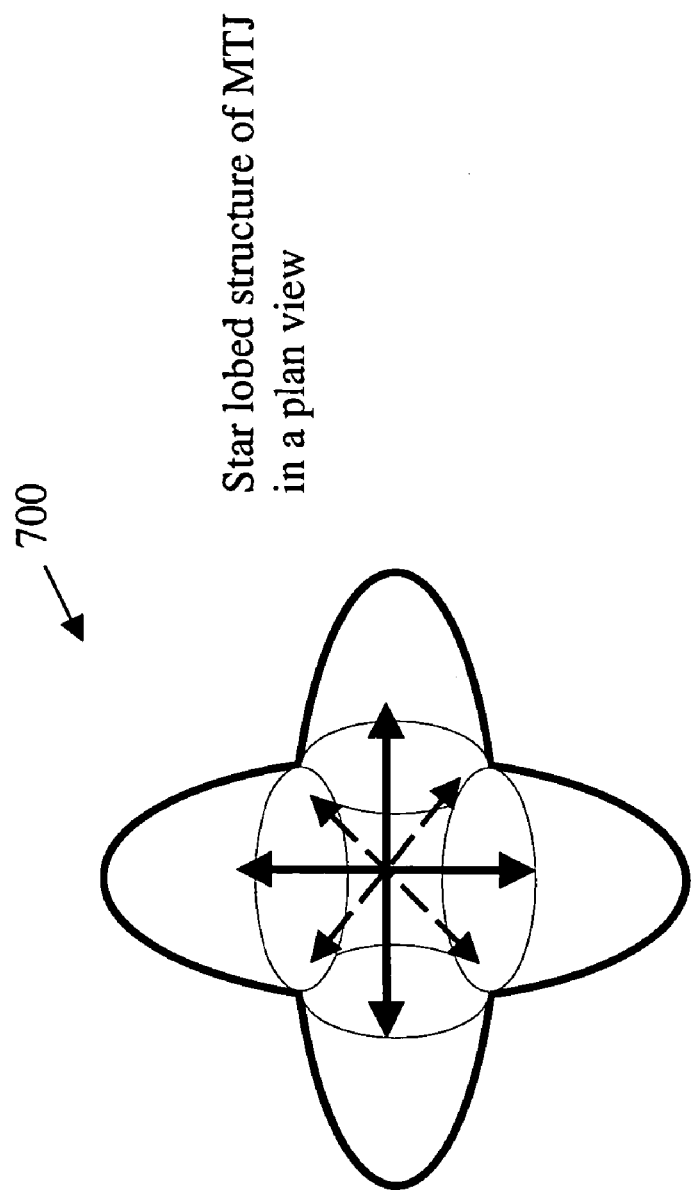
FIG. 7a shows a plan view of an MTJ configured to distinguish two bits.
Figure 7B:
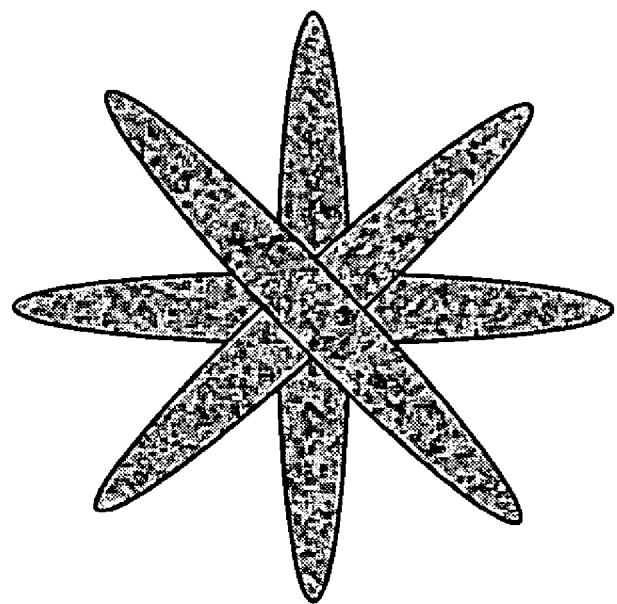
FIG. 7b shows a plan view of an MTJ configured to distinguish three bits.

To store a plurality of bits, the anisotropy of the free layer can be provided by configuring the MTJ cell with a shape anisotropy such as a star-like pattern with two "arms" per bit. An example of such a pattern is shown in a plan view in FIG. 7a wherein a lobed pattern 700 is formed with two overlapping ellipses configured to store two bits. Elongated structures other than ellipses such as rectangles or diamond-like shapes may also be used to form a lobed pattern providing shape anisotropy. Such a pattern as illustrated in FIG. 7a is said to have "C4" symmetry because there are four directions of easy magnetization. The preferred directions of magnetization in the pattern in FIG. 7a are indicated by the solid arrows, and the difficult directions by the dashed arrows. A pattern to store three bits requires C8 symmetry, providing eight stable directions of magnetization for the eight bit combinations as illustrated on FIG. 7b. A simple ellipse has C2 symmetry and stores one bit. Shapes such as circles and squares do not lend themselves to providing shape anisotropy. However, cubic crystal anisotropy with proper orientation of the crystal axes such as a 001 orientation or other intrinsic anisotropy linked to the crystalline structure may be used to obtain C4 symmetry, even with shapes such as circles and squares. Some preferred materials to form a free magnetic layer are Co, Fe, Ni, or alloys of these elements or alloys of these elements with other elements.

Figure 8:
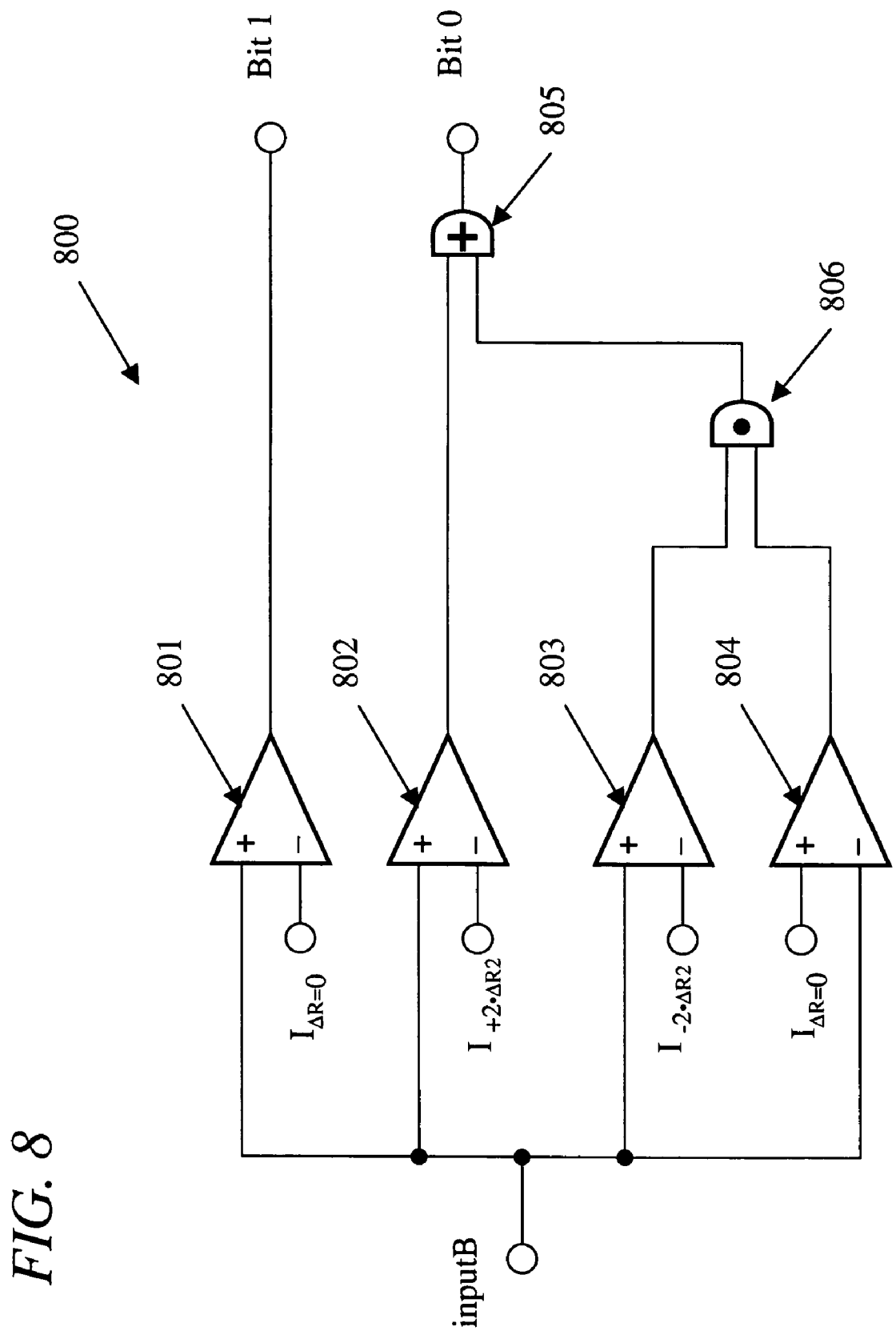
FIG. 8 shows a current sense amplifier configured to distinguish two bits.

Sensing two bits stored in an MTJ stack such as that illustrated in FIG. 6 may be performed using the four-bit current sense amplifier in FIG. 8, representing a preferred embodiment of the present invention, and may be used as a substitute for the one-bit current sense amplifiers illustrate in FIGS. 4a, 4b, and 5. Sensing two stored bits requires distinguishing the four memory states associated with the four stable orientations of the free magnetic layer. The circuit in FIG. 8 includes four current sense amplifiers 801, 802, 803, and 804 that may each be configured with further circuit details similar to the one-bit current sense amplifier illustrated in FIG. 5. The input current, inputB, senses the current flowing through a two-bit MTJ stack to be read. The additional reference current inputs, I$\Delta$R2=0, I+2$\cdot\Delta$R2, and I−2$\cdot\Delta$R2, respectively, are coupled to current sources representing the midpoint current through an MTJ stack (i.e., for $\Delta$R2=0), the current through an MTJ stack with incremental resistance +2$\cdot\Delta$R2, and the current through an MTJ stack with incremental resistance −2$\cdot\Delta$R2. The first output, Bit 1, is read directly from the current sense amplifier 801. The other output, Bit 0, is generated by the OR gate 805 coupled to the AND gate 806 and the current sense amplifier 802. The AND gate 806 in turn is coupled to the current sense amplifiers 803 and 804. Thus a two-bit output, Bit 1, Bit 0, is produced by the circuit in FIG. 8 corresponding to the two bits of data stored in the MTJ stack. Extending the two-bit circuit illustrated in FIG. 8 to sensing three or more bits is straightforward and readily accomplished by those skilled in the art.

Programming an MTJ stack to store two bits requires that the free magnetic layer be selectively orientable in any of four directions that are preferably equally spaced in angle around a circle with sufficient activation energy for reliable data storage. Programming may be performed in accordance with the present invention by using two magnetic field strengths in both of two mutually orthogonal directions. The fields may be produced by an array of current carrying conductors lying in two orthogonal directions. In order to program a neighboring state, i.e., to rotate the direction of the free layer 90 degrees, a small, enabling field is preferably created parallel to the original direction of magnetization, and a strong field in the new, desired direction. The net effect is to create a field that is the superposition of these two fields that is principally in the final desired direction, but rotated slightly toward the original direction of the field of the free layer. The direction of orientation of the field of the free layer can be reversed, i.e., it can be switched to the opposite state, by again creating a small, enabling field, this time perpendicular to the original direction of magnetization, and a strong field in the new, desired direction, i.e., antiparallel to the original direction. Thus all three new magnetic orientations can be programmed for the free layer from any starting direction by a combination of a small field that may be parallel or perpendicular to the original direction of magnetization depending on whether a 90- or 180-degree field rotation is required, and a strong field in the final desired direction. The fields thus created must exceed the critical field strength necessary to effect a transition from an energy minimum to another energy minimum, i.e., they must possess sufficient magnitude and duration to traverse an intervening energy maximum therebetween.

Figure 1:
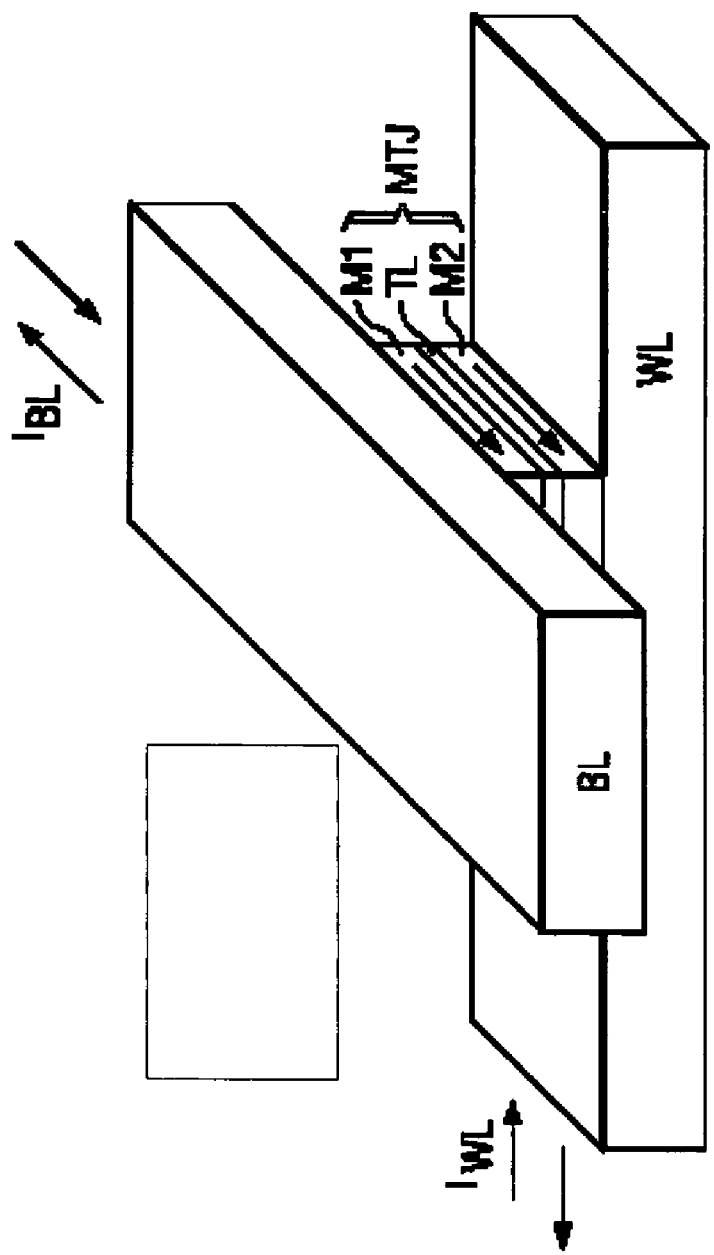
FIG. 1 shows a perspective view of an MTJ stack.
Figure 2:
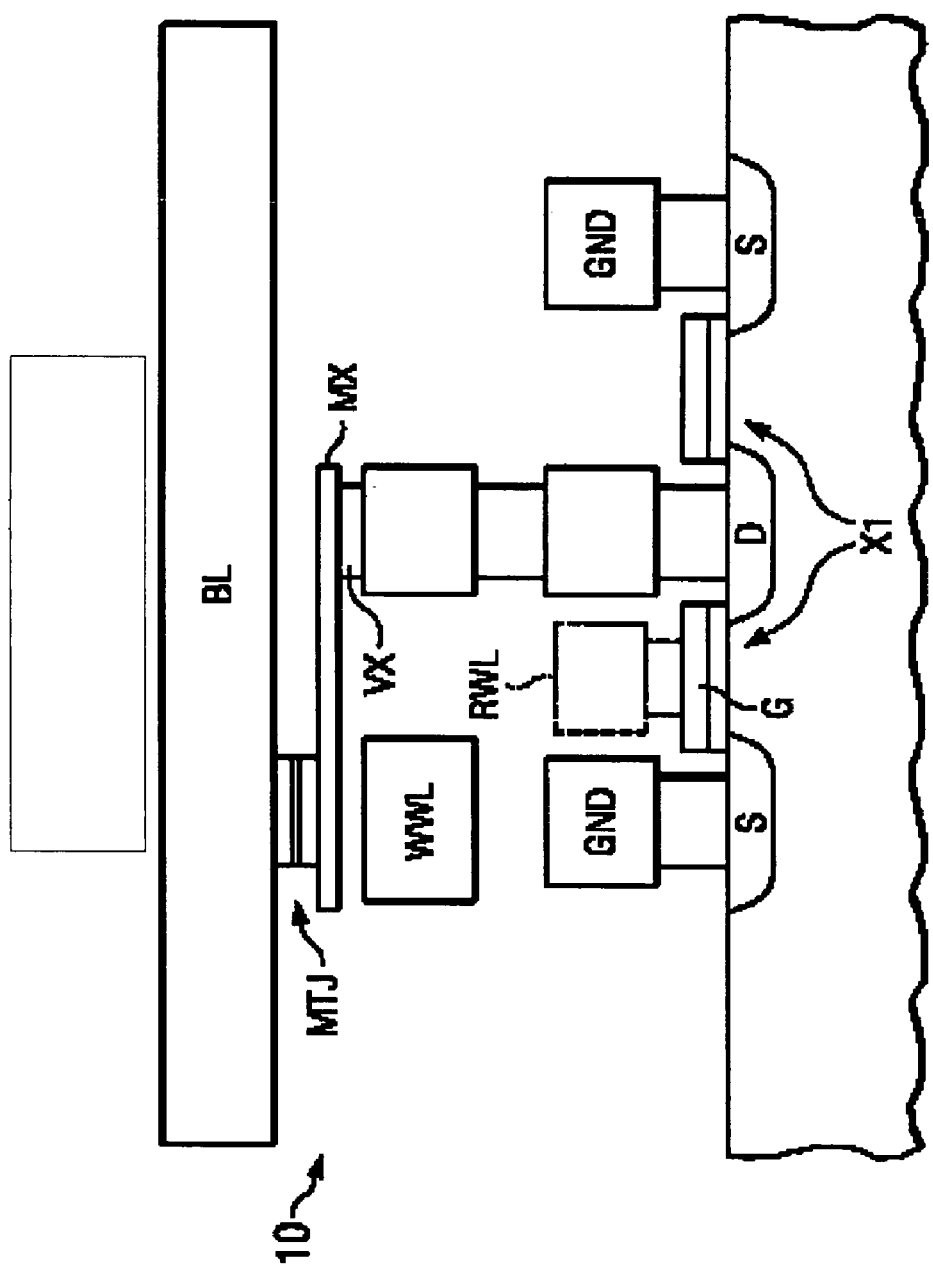
FIG. 2 shows a cross-sectional view of an MRAM device having a select FET.
Figure 3:
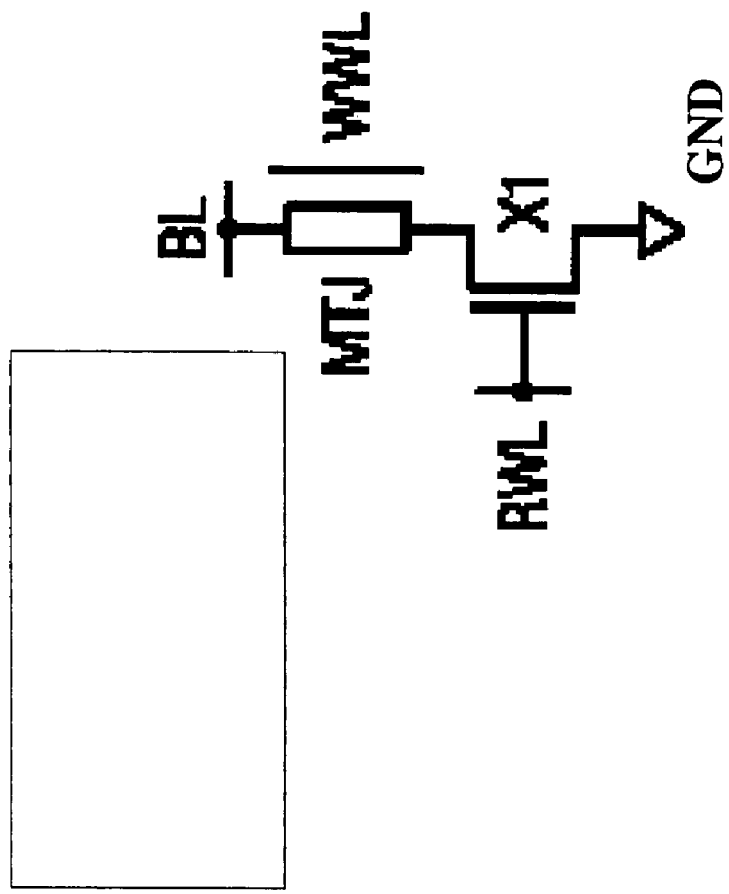
FIG. 3 is a schematic diagram of a memory cell of the memory device shown in FIG. 2.

FIG. 1 illustrates, as described above, a bit line and word line lying in orthogonal directions, capable of creating magnetic fields oriented in perpendicular directions. It is necessary to configure the current sources driving these lines so that either a small or large current can be enabled to flow, depending on the new desired field orientation. This may be accomplished using two current sources for each line, one producing a small current and the other a large current, and selectively enabling the required generator in view of the field orientation to be programmed. The design of current sources is well known in the art, and a number of approaches using current mirrors or operational amplifiers are described in Paul Horowitz and Winfield Hill, "The Art of Electronics," 2nd Edition, Cambridge University Press, 1990, pp. 88–91 and pp. 255–257, which is incorporated herein by reference.

Although an exemplary design has been described for an MTJ stack storing two bits, it can be readily and straight-forwardly extended to storing three or more bits per cell. This may require a pattern for the stack with eight lobes to store three bits, sixteen for four bits, etc. Programming particular field directions for the free layer can be performed by forming a field with sufficient magnitude and duration in the desired direction using superposition of two orthogonal field components as is well understood in the art and described hereinabove. The field directions can be programmed with crossed word and bit lines or with multiple parallel current programming lines, preferably spanning orthogonal directions, lying above or below the MTJ to generate the critical switching current. In general, the current-carrying programming conductors may lie in a plurality of layers. The resulting applied field should be rotated slightly in the direction of the original free-layer field direction to "enable" the field reorientation. A desired field direction can be established by choosing one of a number of current levels that are selectively applied to an array of non-parallel conductors so as to create the required programming field components, using circuit design techniques well known in the art. Such conductors might be formed, for example, and without limitation, by depositing aluminum traces adjacent to the selected cell using photo-etching techniques or by vacuum or chemical vapor deposition processes, as is also well understood in the art.

Figure 9:
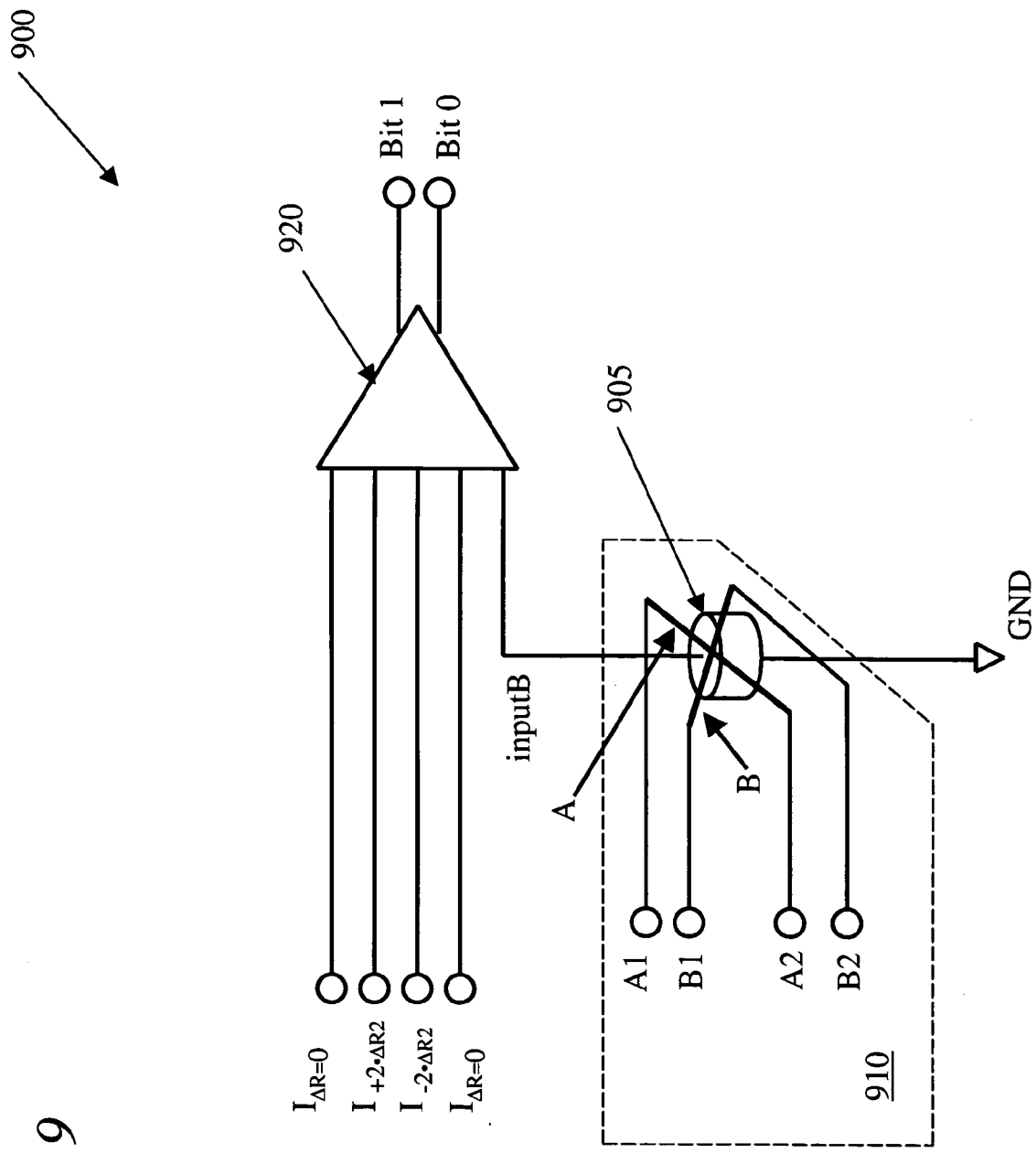
FIG. 9 shows a galvanic isolator configured with a magnetic tunnel junction that can be programmed with two bits of data so that two bits of data can be concurrently transmitted across a dielectric boundary.

Referring now to FIG. 9, illustrated is a galvanic isolator 900 configured with a magnetic tunnel junction 905 that can be programmed with two bits of data as generally described hereinabove so that two bits of data can be concurrently transmitted across a dielectric boundary. The MTJ 905 is programmed by non-parallel current carrying conductors A and B that are coupled to current-carrying inputs A1, A2 and B1, B2, respectively. The current-carrying conductors A and B and their respective connections to the inputs A1, A2 and B 1, B2 are dielectrically isolated from the portions of the circuit that are coupled to the output and are contained in the area 910 as illustrated in the figure. Dielectric material separating the region 910 from the remainder of the circuit is not shown. The resistive state of the MTJ 905 which is shown coupled to ground GND is sensed with the two-bit current sense amplifier 920 that provides outputs Bit 1 and Bit 0 as illustrated in the figure. A two-bit current sense amplifier such as 920 may be configured as previously described above with reference to FIG. 8. The reference current inputs $I_{\Delta R2=0}$, $I_{+2 \cdot \Delta R2}$, and $I_{-2 \cdot \Delta R2}$ correspond to the similarly labeled current inputs illustrated in FIG. 8. The MTJ current is sensed at the node inputB. Further circuit details such as voltage clamping transistors and bias voltage sources such as illustrated in FIG. 5 have been omitted for brevity. Thus the two-bit current sense amplifier 920 represents the four current sense amplifiers 801, 802, 803, and 804 and the logic gates 805 and 806 illustrated in FIG. 8. The arrangement illustrated in FIG. 9 can be used to construct a two-bit galvanic isolator that can provide data rates substantially higher than that achievable with an ordinary opto-isolator. When an MTJ is configured as a galvanic isolator, the programmability function of the MTJ is used in a substantially uninterrupted store-read sequence to provide the function of data transmission across an isolation boundary. A galvanic isolator transmitting more than two bits is a straightforward extension of the arrangement illustrated in FIG. 9. The present invention preferably uses current sensing to sense the programmed state of a magnetic memory cell, but voltage sensing may also be used.

The MTJ 905 is programmed to communicate two bits in a manner similar to that described above to program an MTJ stack used as a memory cell to store two bits. This generally requires that the free magnetic layer be selectively orientable as previously discussed hereinabove in any of four directions that are preferably equally spaced in angle around a circle with sufficient activation energy for reliable data communication. Programming may be performed in accordance with the present invention by using two magnetic field strengths in both of two mutually orthogonal directions created by the conductors A and B. Sequencing of currents through these conductors would be similar to that described above for an MTJ memory cell storing two bits and will not be repeated in the interest of brevity.

Appendix A contains figures, such as, the one labeled "Out [7]=-Graphics-" which plot components of the minimal H-field for altering the magnetization direction of a free ferromagnetic layer that has various stable orientations. Such diagrams are frequently referred to as "asteroids", and are described in the book by T. H. Beeforth and H. J. Goldsmid, "Physics of Solid State Devices," Pion Ltd., 1970, Section 6.4. Other figures in the appendix plot energy at different H-fields and field orientations. By observing the energy of the configuration, stable and unstable orientations can be seen: energy minima represent stable orientations, and maxima, unstable. By varying an applied field component, a stable orientation can be transitioned to an unstable one, and unstable ones can become stable. This permits controlled field reorientations of the free layer. The figures illustrate orientation transitions that occur when varying the applied H-field.

Although embodiments of the present invention and its advantages have been described in detail, it should be understood that various changes, substitutions and alterations can be made herein without departing from the spirit and scope of the invention as defined by the appended claims. For example, it will be readily understood by those skilled in the art that the circuits, circuit elements, current sensing arrangements, and utilization of techniques and materials to form the thin films comprising the magnetic and insulating layers described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A magnetic tunnel junction (MTJ) configured to be programmed with a plurality of bits, comprising:
    a soft ferromagnetic layer requiring a low coercivity to magnetize or demagnetize or to change its magnetic orientation, with magnetic anisotropy configured so that the magnetic field of the soft ferromagnetic layer has at least four stable orientations;
    two hard ferromagnetic layers requiring substantial coercivity to magnetize or demagnetize or to change its magnetic orientation, formed on either side of the soft ferromagnetic layer with magnetic fields oriented in different directions;
    insulating layers separating the two hard ferromagnetic layers from the soft ferromagnetic layer, each insulating layer having a distinguishable resistance that is dependent on the direction of magnetization of the soft ferromagnetic layer;

conductors configured to carry currents to produce magnetic fields to alter the orientation of the magnetic field of the soft ferromagnetic layer; and a sense amplifier configured to sense the resistance of the MTJ.

2. The MTJ according to claim 1, wherein the sense amplifier is configured as a current sense amplifier.

3. The MTJ according to claim 1, wherein the soft ferromagnetic layer is formed with a pattern with at least four lobes.

4. The MTJ according to claim 1, wherein at least four distinguishable resistances of the MTJ are produced by at least four corresponding stable orientations of the magnetic field of the soft ferromagnetic layer.

5. The MTJ according to claim 4, wherein the insulating layers are formed with different thicknesses so as to produce the at least four distinguishable resistances for the MTJ corresponding to the stable orientations of the magnetic field of soft ferromagnetic layer.

6. The MTJ according to claim 4, wherein the insulating layers are formed with different material compositions so as to produce the at least four distinguishable resistances for the MTJ corresponding to the stable orientations of the magnetic field of soft ferromagnetic layer.

7. The MTJ according to claim 1, wherein the magnetic fields of the two hard ferromagnetic layers are oriented in substantially perpendicular directions.

8. The MTJ according to claim 1, wherein an antiferromagnetic layer is formed adjacent to each hard ferromagnetic layer.

9. The MTJ according to claim 1, wherein the soft ferromagnetic layer with magnetic anisotropy is configured as a synthetic antiferromagnetic layer.

10. The MTJ according to claim 1, wherein the conductors formed adjacent to the MTJ span two orthogonal directions.

11. The MTJ according to claim 1, wherein the sense amplifier is configured to sense at least four distinguishable resistances of the MTJ.

12. The MTJ according to claim 1, wherein the MTJ is configured as a galvanic isolator to communicate a plurality of bits across a dielectric boundary.

13. The MTJ according to claim 12, wherein the MTJ is operated in a substantially uninterrupted store-read sequence.

14. The MTJ according to claim 12, wherein the conductors configured to carry currents to produce the magnetic fields to alter the orientation of the magnetic field of the soft ferromagnetic layer are dielectrically isolated from the sense amplifier configured to sense the resistance of the MTJ.

15. A magnetic random access memory device, comprising:

an array of a plurality of MTJ memory cells, each cell comprised of a soft ferromagnetic layer requiring a low coercivity to magnetize or demagnetize or to change its magnetic orientation, with magnetic anisotropy configured so that the magnetic field of the soft ferromagnetic layer has at least four stable orientations;

two hard ferromagnetic layers requiring substantial coercivity to magnetize or demagnetize or to change its magnetic orientation, formed on either side of the soft ferromagnetic layer in each cell with magnetic fields oriented in different directions;

insulating layers separating the two hard ferromagnetic layers from the soft ferromagnetic layer in each cell, each insulating layer having a distinguishable resistance that is dependent on the direction of magnetization of the soft ferromagnetic layer;

conductors configured to carry currents to produce magnetic fields to selectively alter the orientation of the magnetic field of a soft ferromagnetic layer; and a sense amplifier configured to selectively sense the resistance of an MTJ.

16. The magnetic random access memory device according to claim 15, wherein the sense amplifier is configured as a current sense amplifier.

17. The magnetic random access memory device according to claim 15, wherein the soft ferromagnetic layer in each cell is formed with a pattern with at least four lobes.

18. The magnetic random access memory device according to claim 15, wherein the at least four distinguishable resistances of the cells are produced by at least four corresponding stable orientations of the magnetic field of each soft ferromagnetic layer.

19. The magnetic random access memory device according to claim 18, wherein the insulating layers in each cell are formed with different thicknesses so as to produce the at least four distinguishable resistances for the MTJs corresponding to the stable orientations of the magnetic field of the soft ferromagnetic layer in each cell.

20. The magnetic random access memory device according to claim 18, wherein the insulating layers in each cell are formed with different material compositions so as to produce the at least four distinguishable resistances for the MTJs corresponding to the stable orientations of the magnetic field of soft ferromagnetic layer in each cell.

21. The magnetic random access memory device according to claim 15, wherein the soft ferromagnetic layer with magnetic anisotropy is configured as a synthetic antiferromagnetic layer.

22. The magnetic random access memory device according to claim 15, wherein the magnetic fields of the two hard ferromagnetic layers in each cell are oriented in substantially perpendicular directions.

23. The magnetic random access memory device according to claim 15, wherein an antiferromagnetic layer is formed adjacent to each hard ferromagnetic layer in each cell.

24. The magnetic random access memory device according to claim 15, wherein the conductors span two orthogonal directions.

25. The magnetic random access memory device according to claim 15, wherein the sense amplifier is configured to sense at least four distinguishable resistances of an MTJ.

26. A method of configuring an MTJ to be programmable with a plurality of bits, comprising:

forming a soft ferromagnetic layer requiring a low coercivity to magnetize or demagnetize or to change its magnetic orientation with magnetic anisotropy, and configuring the magnetic field of the soft ferromagnetic layer so that it has at least four stable orientations;

forming hard ferromagnetic layers requiring substantial coercivity to magnetize or demagnetize or to change its magnetic orientation on either side of the soft ferromagnetic layer with magnetic fields oriented in different directions;

separating the two hard ferromagnetic layers from the soft ferromagnetic layer with insulating layers, each insulating layer having a distinguishable resistance that is dependent on the direction of magnetization of the soft ferromagnetic layer;

forming conductors at right angles to each other and configuring the conductors to carry currents to produce magnetic fields that can alter the orientation of the magnetic field of the soft ferromagnetic layer; and configuring a sense amplifier to sense the resistance of the MTJ.

27. The method according to claim 26, including configuring the sense amplifier as a current sense amplifier.

28. The method according to claim 26, including forming the soft ferromagnetic layer with a pattern with at least four lobes.

29. The method according to claim 26, including producing at least four distinguishable resistances of the MTJ with at least four corresponding stable orientations of the magnetic field of the soft ferromagnetic layer.

30. The method according to claim 29, including forming the insulating layers with different thicknesses so as to produce the at least four distinguishable resistances for the MTJ corresponding to the stable orientations of the magnetic field of soft ferromagnetic layer.

31. The method according to claim 29, including forming the insulating layers with different material compositions so as to produce the at least four distinguishable resistances for the MTJ corresponding to the stable orientations of the magnetic field of soft ferromagnetic layer.

32. The method according to claim 26, including orienting the magnetic fields of the two hard ferromagnetic layers in substantially perpendicular directions.

33. The method according to claim 26, including forming an antiferromagnetic layer adjacent to each hard ferromagnetic layer.

34. The method according to claim 26, including forming conductors adjacent to the MTJ spanning two orthogonal directions.

35. The method according to claim 26, including configuring the sense amplifier to sense at least four distinguishable resistances of an MTJ.

36. The method according to claim 26, including configuring the MTJ as a galvanic isolator to communicate a plurality of bits across a dielectric boundary.

37. The method according to claim 26, including operating the MTJ in a substantially uninterrupted store-read sequence.

38. The method according to claim 36, including configuring the conductors that carry currents to produce the magnetic fields that alter the orientation of the soft ferromagnetic layer to be dielectrically isolated from the current sense amplifier that is configured to sense the resistance of the MTJ.

* * * * *